United States Patent [19]

Couden et al.

[11] Patent Number: 4,941,724
[45] Date of Patent: Jul. 17, 1990

[54] OPTICAL FIBER CONNECTION UTILIZING PHOTODIODE MEANS

[75] Inventors: Donald V. Couden, Boca Raton; Paul C. Karr, Ormond Beach; Layton Balliet, Boca Raton, all of Fla.

[73] Assignee: International Business Machines Corporation, Armonk, N.Y.

[21] Appl. No.: 237,338

[22] Filed: Aug. 29, 1988

[51] Int. Cl.⁵ .............................................. G02B 6/32
[52] U.S. Cl. ............................ 350/96.18; 350/96.21; 350/96.15
[58] Field of Search ............... 350/96.18, 96.15, 96.20, 350/96.21

[56] References Cited

U.S. PATENT DOCUMENTS

| | | | |
|---|---|---|---|
| 4,102,559 | 7/1978 | Hunzinger | 350/96.18 |
| 4,165,496 | 8/1979 | DiDomenico, Jr. et al. | 331/94.5 |
| 4,273,412 | 1/1981 | Hillegonds | 350/96.20 |
| 4,421,383 | 12/1983 | Carlsen | 350/96.20 X |
| 4,558,920 | 12/1985 | Newton et al. | 350/96.15 |
| 4,650,277 | 3/1987 | Husher et al. | 350/96.15 X |
| 4,798,428 | 1/1989 | Karim et al. | 350/96.18 |

OTHER PUBLICATIONS

IBM Technical Disclosure Bulletin, vol. 27, No. 1B, Jun. 1984.

*Primary Examiner*—John D. Lee
*Assistant Examiner*—Phan T. Heartney

[57] ABSTRACT

A method and apparatus for tapping fiber optic devices is provided. An input optical fiber is connected to a graded index lense which will collimate light from the input fiber. A second graded index lense is provided in optical alignment with the first lense, which receives and decollimates the light collimated by the first lense. A sensor, such as a photodiode, is interposed between the lenses to intercept a minor portion of the light being transmitted to the second lense, and convert the sensed light to a signal indicative of a selected characteristic of the light.

5 Claims, 3 Drawing Sheets

OPTICAL FIBER CONNECTION UTILIZING PHOTODIODE MEANS

BACKGROUND OF THE INVENTION

1. Field of the Invention

This invention relates generally to fiber optic connections, and more particularly to a method and apparatus for tapping a fiber optic system.

2. Prior Art

In the field of fiber optics, light beams are used as communication carriers of coded information, either in digital or analog form. In order to use the information carried by the light, it is necessary to provide an optical tap to "read" or "sense" the information. One of the problems associated with tapping the light are losses of light at the tap. Various techniques for tapping are shown in U.S. Pat. No. 4,555,920 to Newton et al; U.S. Pat. No. 4,273,412 to Hillegoods; IBM Technical Disclosure Bulletin Vol 27, No. 18, June, 1984, pp. 543 to 546; and U.S. Pat. No. 4,165,496 to DiDomineco et al.

These techniques, involving fusing of fibers, and the use of various couplers, and other techniques involving half mirrors, all have several serious drawbacks. One of the most common drawbacks is the relatively high loss e.g. about 3 dB per connection, which greatly reduces the light transmitted past the tap. This is especially critical when there are several taps to be made, since at each tap, if the loss is great at each tap, the amount of light being transmitted on is reduced such that a condition is rapidly reached that the light power is so diminished that it is no longer usable as a communications carrier.

SUMMARY OF THE INVENTION

According to the present invention, a method and apparatus is provided to tap a fiber optic system with only small loss in power. In this invention, first and second fibers are provided and a collimating lense is connected to said first fiber. The collimated light is transmitted to a spaced decollimating lense which is connected to the second optical fiber to provide decollimated light thereto. Sensing means, such as a photodiode, are placed in the path of the collimated light between the lenses to intercept a minor portion of collimated light and generate a signal indicative of a selected characteristic of the light, e.g. information carried by the light.

DESCRIPTION OF THE PREFERRED EMBODIMENTS

Figure 1:
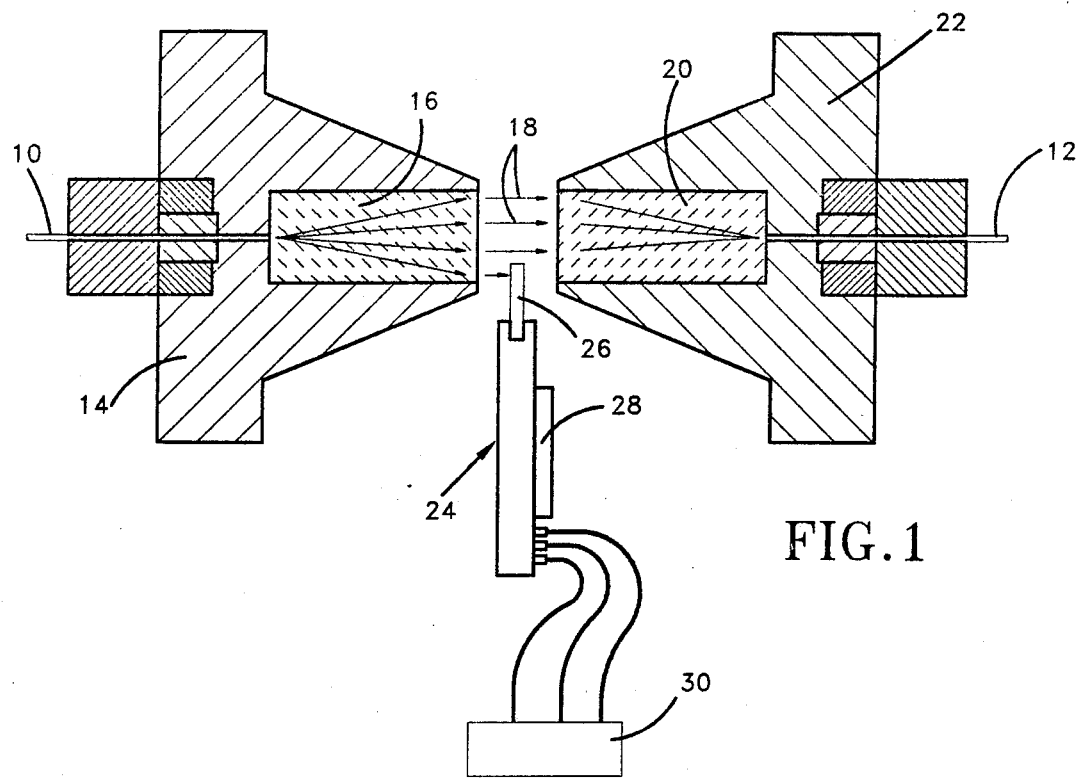
FIG. 1 is a longitudinal sectional view, somewhat diagrammatic of an optical tap according to this invention.

Referring now to the drawings, and for the present to FIG. 1, a longitudinal sectional view somewhat diagrammatic of one embodiment of an optical tap according to this invention is shown. The apparatus includes an input optical fiber 10 and an output optical fiber 12. The input fiber 10 is secured in an optical connector 14, which connector mounts a graded index (GRIN) lense 16. The input fiber 10 is secured to the end of the GRIN lense 16, and light transmitted by the fiber 10 will be collimated and transmitted as depicted at 18. A technique for connecting and utilizing a graded index lense with an optical fiber, such as the type sold by Nippon Sheet Glass Co. under the name SELFOC, is described in IBM Technical Disclosure Bulletin Vol. 27, No. 2, July, 1984, pp. 1311-1312.

A second graded index lense 20 is provided in optical alignment with the lense 16 to receive and decollimate the collimated light 18. The lense 20 is mounted in a second connector 22 and is connected to the end of the optical fiber 12 to deliver decollimated light thereto. The connector 22 mounts the lense 20 in spaced relationship with respect to lense 16.

A sensor 24 is provided which includes a photodiode 26, an amplifier 28, and a signal detector 30. The photodiode 26 is interposed between the lenses 16 and 20 and is positioned in the path of the collimated light 18. The diode 26 is so positioned in the light path that it intercepts enough light to generate a signal responsive thereto and allow the reading of the desired characteristic of the light without error. This positioning requires that only a minor portion of the light be intercepted, and allows a major portion of the light to be transmitted to the decollimating lense 20. The photodiode may be of any conventional design. For example, a PIN type diode is shown in IBM Technical Disclosure Bulletin Vol. 26, No. 12, May, 1984, pp. 6329-6333, which is of the type of construction that can be used herein.

By utilizing this arrangement, a very efficient tap is provided having very low losses, even less than 1 dB as compared to 3 dB or more in prior art.

Figure 2:
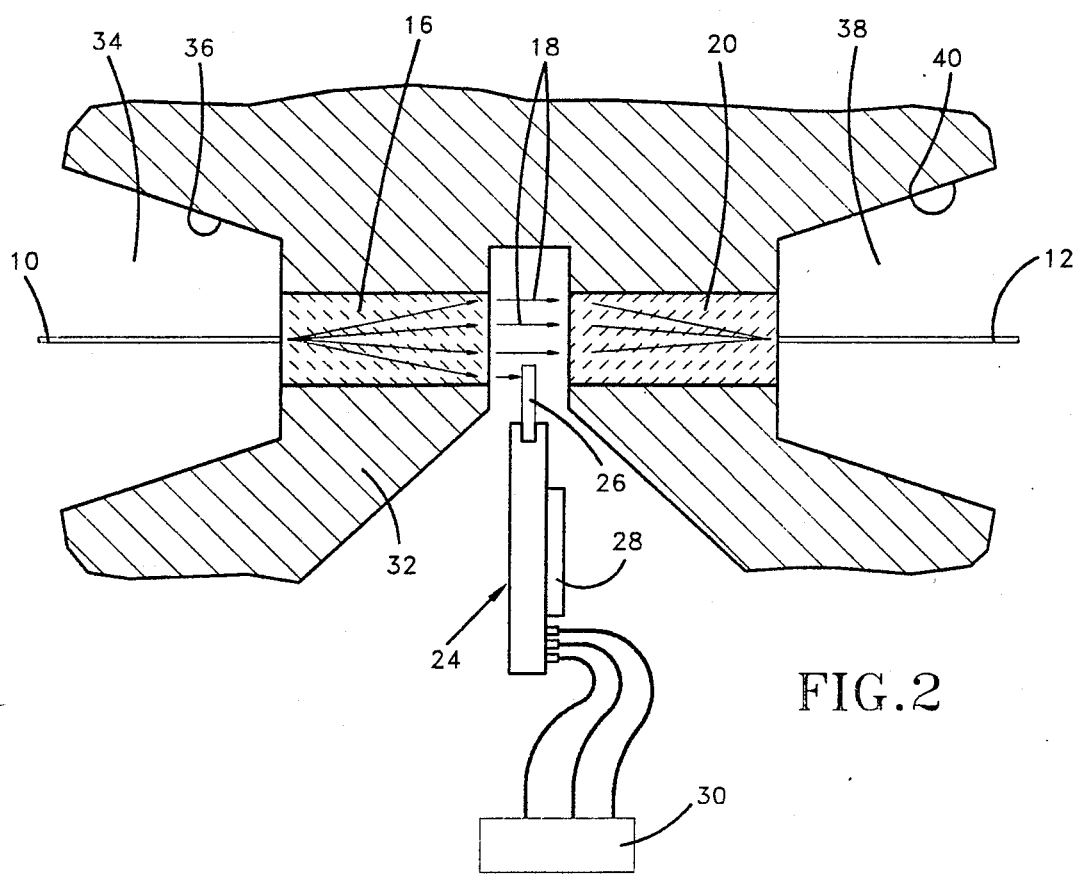
FIG. 2 is a view similar to FIG. 1 of another embodiment of an optical tap according to this invention.

FIG. 2 is a slightly modified form of the invention shown in FIG. 1. In this FIG., the collimating lense 16 and decollimating lense 20 are carried in a support member 32 and maintained a fixed distance apart. An optical connector 34 mounts input fiber 10 and is removably receivable in aperture 36 formed in the support member 32, and adapted to maintain the end of the input fiber 10 in contact with the lense 16. Similarly, another optical connector 38 mounts output fiber 12 and is removably receivable in aperture 40 formed in support member 32, and adapted to maintain the output fiber in contact with lense 20. In other respects, this embodiment of the invention is the same as shown in FIG. 1. This embodiment is particularly desirable if the optical fibers are to be changed frequently, since the lenses do not have to be removed and handled for changing of the fibers.

Figure 3:
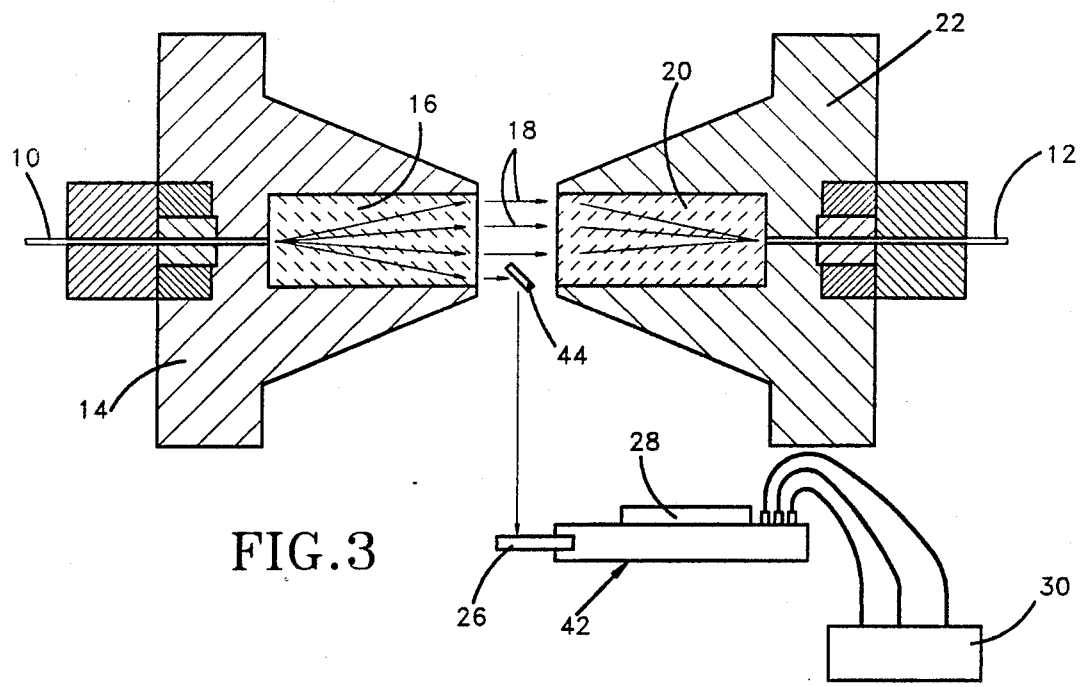
FIG. 3 is a view similar to FIG. 1 of yet another embodiment of an optical tap according to this invention.

FIG. 3 discloses yet another modification of the device shown in FIG. 1. In this instance, the sensor 42 includes a mirror 44 which is disposed in the path of collimated light 18. The mirror reflects a minor portion of the light to a photodiode 26 which generates a signal through amplifier 28, and the signal is read by the signal detector 30. Similarly, a prism could be used rather than a mirror for intercepting the light.

Figure 4:
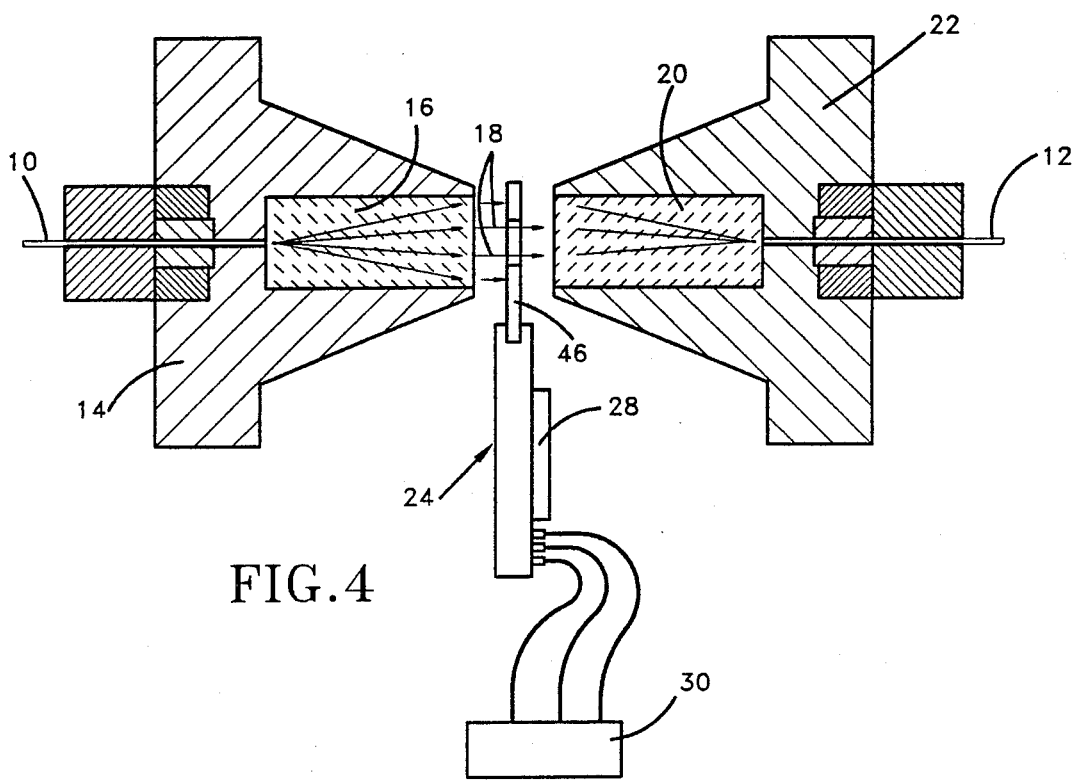
FIG. 4 is a view similar to FIG. 1 of still another embodiment of an optical tap according to this invention.

In FIG. 4, yet another embodiment of the invention is shown. In this embodiment, the sensor 46 includes a photodiode 46, which has a central aperture 48. The photodiode is disposed in the path of the collimated light 18. The central aperture 48 allows a major portion of the light 18 to pass through and reach the decollimating lense 20, while the ring portion surrounding the aperture 48 intercepts a minor portion of the light and converts it to electrical signals as previously described.

Figure 5:
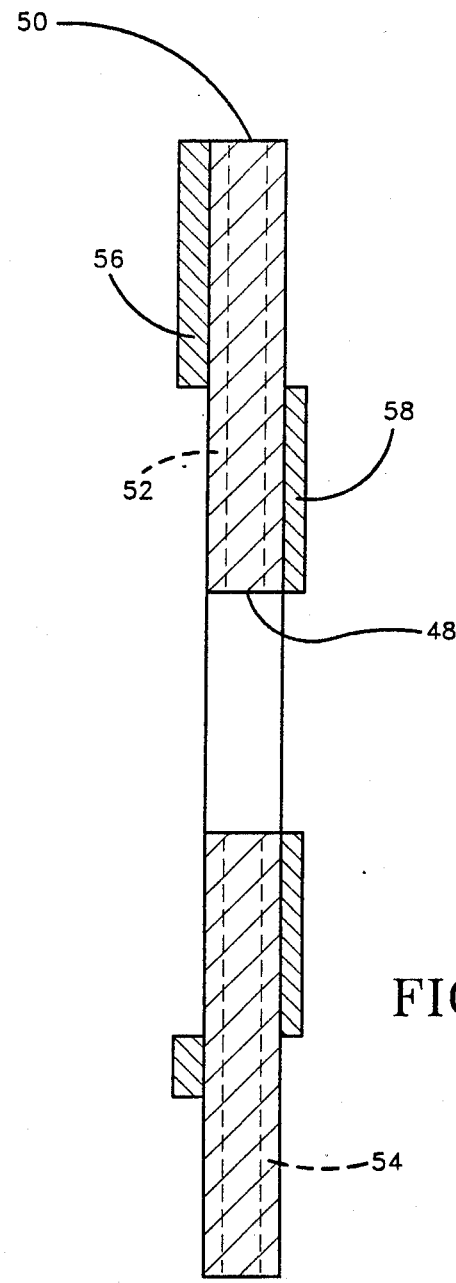
FIG. 5 is an enlarged sectional view of the photodiode shown in FIG. 4.

FIG. 5 shows an enlarged sectional view of the photodiode 46 utilized in the embodiment of FIG. 4. The photodiode includes a silicon wafer base material 50, though which the aperture 46 is drilled. The side of the wafer 50 directed toward the lense 16 has a doped "p" region 52 and the side facing the lense 20 has a doped "n" region 54. In this case, the anode contact 56 is formed on the "p" side of the wafer and the cathode 58 is disposed on the "n" side of the wafer. This increases the efficiency of the photodiode by eliminating the cathode contact from the side of the photodiode that faces the received light.

While the invention has been described in some detail, various adaptations and modifications can be made without departing from the scope of the invention.

What is claimed is:

1. Apparatus for tapping a fiber optic system, which system includes first and second optical fibers, comprising;
   (a) first lense means adapted to be optically connected to said first optical fiber for collimating light transmitted by said first optical fiber on a light path;
   (b) second lense means, spaced from and in optical alignment with said first lense means, adapted to be optically connected to said second optical fiber for decollimating light received from said first lense means and providing said decollimated light to said second optical fiber; and
   (c) discrete sensing means interposed intermediately between said first and second lense means and physically positioned to intercept a minor portion of the collimated light from said first lense means, and adapted to generate a signal indicative of a characteristic of said collimated light;
   wherein said sensing means includes a photodiode characterized by support means carrying said photodiode, said support means being further characterized by aperture means therein positioned to pass a major portion of the collimated light;
   whereby, a minor portion of the light transmitted is used to tap a signal by said photodiode and a major portion is passed on through said aperture means.

2. The invention as defined in claim 1, wherein said photodiode at least partially surrounds said aperture.

3. The invention as defined in claim 1, wherein said support means constitutes a portion of said photodiode.

4. The invention as defined in claim 1, wherein said first and second lense means are fixedly mounted, and first and second connector means are provided to removably connect each of said first and second optical fibers to said first and second lense means, respectively.

5. Apparatus for tapping a fiber optic system, which system includes first and second optical fibers, comprising;
   (a) first lens means adapted to be optically connected to said first optical fiber for collimating light transmitted by said first optical fiber on a light path and wherein said collimated light incorporated decodable information as a characteristic thereof;
   (b) second lense means, spaced from and in optical alignment with said first lense means, adapted to be optically connected to said second optical fiber for decollimating light received from said first lense means and providing said decollimated light to said second optical fiber; and
   (c) discrete sensing means interposed intermediately between said first and second lense means and physically positioned to intercept a minor portion of the collimated light from said first lense means, and adapted to generate a signal indicative of a characteristic of said collimated light and wherein said sensing means includes means to represent said decodable information in said signal generated thereby;
   wherein said sensing means includes a photodiode characterized by support means carrying said photodiode, said support means being further characterized by aperture means therein positioned to pass a major portion of the collimated light;
   whereby, a minor portion of the light transmitted is used to tap a signal containing information and a major portion is passed on.

* * * * *